US009960104B2

(12) United States Patent
Sun (10) Patent No.: US 9,960,104 B2
(45) Date of Patent: May 1, 2018

(54) INTEGRATED PACKAGE DESIGN WITH WIRE LEADS FOR PACKAGE-ON-PACKAGE PRODUCT (71) Applicant: INTEL CORPORATION, Sunnyvale, CA (US)

(72) Inventor: Zhiyong Simon Sun, Shanghai (CN)

(73) Assignee: Intel Corporation, Santa Clara, CA (US)

( * ) Notice: Subject to any disclaimer, the term of this patent is extended or adjusted under 35 U.S.C. 154(b) by 0 days. days.

(21) Appl. No.: 14/777,411

(22) PCT Filed: Dec. 23, 2014

(86) PCT No.: PCT/CN2014/094665
§ 371 (c)(1),
(2) Date: Sep. 15, 2015

(87) PCT Pub. No.: WO2016/101151
PCT Pub. Date: Jun. 30, 2016

(65) Prior Publication Data
US 2016/0372404 A1 Dec. 22, 2016

(51) Int. Cl.
*H01L 23/28* (2006.01)
*H01L 23/495* (2006.01)
(Continued)

(52) U.S. Cl.
CPC .... *H01L 23/49503* (2013.01); *H01L 21/4842* (2013.01); *H01L 21/561* (2013.01);
(Continued)

(58) Field of Classification Search
CPC .......... H01L 23/49503; H01L 23/4951; H01L 23/4952; H01L 21/561; H01L 21/4842
(Continued)

(56) References Cited

U.S. PATENT DOCUMENTS 7,411,289 B1  8/2008 McLellan et al.
2005/0139969 A1* 6/2005 Lee ..................... H01L 23/3107
257/672
(Continued)

FOREIGN PATENT DOCUMENTS

CN  203434153     2/2014
JP  H02-239651 A  9/1990
(Continued)

OTHER PUBLICATIONS

PCT/CN2014/094665 PCT Notification of Transmittal of the International Search Report and the Written Opinion of the International Searching Authority, or the Declaration, dated Jul. 17, 2014, 12 pages.
(Continued)

*Primary Examiner* — Long K Tran
(74) *Attorney, Agent, or Firm* — Schwabe, Williamson & Wyatt, P.C.

(57) ABSTRACT

An integrated package design for a package-on-package product is described that uses wire leads. Some embodiments pertain to a stacked package assembly that includes a first die having a front side and a back side, a die paddle attached to the back side of the first die, a plurality of wire leads, one end being connected to the front side of the die for connection to an external device, a mold compound encapsulating the first die and at least a portion of the die paddle, a land pad cut from the die paddle and supported by the mold compound, a second plurality of wire leads, one end of the wire leads being connected to the front side of the first die and the other end of the wire leads being connected to the land pad, a second die stacked over the die paddle and a third plurality of wire leads, one end being connected to the second die and the other end being connected to the land pad.

18 Claims, 6 Drawing Sheets (51) Int. Cl.
   *H01L 21/48*   (2006.01)
   *H01L 21/56*   (2006.01)
   *H01L 23/31*   (2006.01)
   *H01L 25/10*   (2006.01)

(52) U.S. Cl.
   CPC ...... *H01L 23/3107* (2013.01); *H01L 23/4952* (2013.01); *H01L 23/49506* (2013.01); *H01L 23/49541* (2013.01); *H01L 23/49555* (2013.01); *H01L 25/105* (2013.01); H01L 2224/48247 (2013.01); H01L 2225/1029 (2013.01); H01L 2225/1052 (2013.01); H01L 2924/0002 (2013.01); H01L 2924/181 (2013.01)

(58) Field of Classification Search
   USPC ................................................. 257/787, 790
   See application file for complete search history.

(56) References Cited

U.S. PATENT DOCUMENTS

| | | | | |
|---|---|---|---|---|
| 2008/0157325 | A1* | 7/2008 | Chow | ................ H01L 23/3128 257/686 |
| 2008/0273312 | A1* | 11/2008 | Bathan | .............. H01L 23/49503 361/752 |
| 2009/0001529 | A1 | 1/2009 | Lee et al. | |
| 2009/0072366 | A1 | 3/2009 | Govindaiah et al. | |
| 2010/0008058 | A1* | 1/2010 | Saen | ..................... H01L 23/481 361/803 |
| 2010/0123229 | A1* | 5/2010 | Bathan | ................ H01L 21/4832 257/676 |
| 2010/0314731 | A1* | 12/2010 | Camacho | ............. H01L 21/565 257/676 |
| 2014/0159222 | A1 | 6/2014 | Hong et al. | |
| 2014/0268612 | A1 | 9/2014 | Zhang et al. | |
| 2014/0367848 | A1 | 12/2014 | Chi et al. | |
| 2015/0001689 | A1* | 1/2015 | Goetz | ................... H01L 23/552 257/659 |

FOREIGN PATENT DOCUMENTS

| | | |
|---|---|---|
| JP | H11-330306 A | 11/1999 |
| JP | 2004-031650 A | 1/2004 |
| JP | 2009-038375 A | 2/2009 |
| JP | 2010-212421 A | 9/2010 |
| JP | 2014-116602 A | 6/2014 |
| JP | 2014116602 | 6/2014 |
| KR | 10-2001-068614 | 1/2000 |
| KR | 20040037561 | 5/2004 |
| TW | 200915521 | 4/2009 |

OTHER PUBLICATIONS

Taiwan (R.O.C.) Search Report from counterpart Taiwan Patent Application No. 104138592, dated Aug. 23, 2016, 1 page.
Notice of Reasons for Rejection dated Jan. 31, 2017 for Japanese Patent Application No. 2016-565534 (2 pages) and English Translation (3 pages) thereof.
Notice of Reasons for Refusal dated Aug. 28, 2017 for Japanese Patent Application No. 2016-565534 (2 pages) and English Translation (3 pages) thereof.
Communication Extended European Search Report dated Jun. 29, 2017 for European Patent Application No. 14893691.7-1552/ 3058590, PCT/CN20140944665 (12 pages).
Notification Concerning Transmittal of International Preliminary Report on Patentability dated Jul. 6, 2017 for PCT/CN2014/ 094665(5 Pages).
Notification Concerning Transmittal of International Search Report and the Written Opinion of the International Searching Authority dated Jul. 15, 2015 for PCT/CN2014/094665 (12 Pages).
Office Action from Chinese Patent Application No. 201480029748. 2, dated Dec. 25, 2017, 7 pages.

* cited by examiner

INTEGRATED PACKAGE DESIGN WITH WIRE LEADS FOR PACKAGE-ON-PACKAGE PRODUCT

CROSS-REFERENCE TO RELATED APPLICATION

This patent application is a U.S. National Phase Application under 35 U.S.C. § 371 of International Application No. PCT/CN2014/094665, filed Dec. 23, 2014, entitled INTEGRATED PACKAGE DESIGN WITH WIRE LEADS FOR PACKAGE-ON-PACKAGE PRODUCT.

FIELD

The present disclosure relates to the field of stacked package on package and in particular to a stacked package on package with wire leads.

BACKGROUND

IC (Integrated Circuit) dies are typically packaged before installation in order to protect the die from the external environment. The package may be formed of a simple plastic cover, an encapsulating resin, or other materials. Some packages offer more functions such as power or signal conditioning, and provide a transition from the die to a particular type of connection configuration for when the package is installed in a device.

With the continued reduction in size of devices and their associated electronics, packages are required to perform more functions and contain more processing power. Since packages may be much larger than the dies that they contain, some packages contain more than one die. This can be used to combine a central processor with a graphics processor or with a communications die. With enough components, this type of package may be referred to as System in a Package.

Instead of putting multiple dies in a single package, the packages may be stacked. Stacked packages, when properly designed may allow more processing power or electronic components to be placed in less space. PoP (Package-on-Package) is an IC packaging method that vertically combines discrete component packages. This allows the components to use less space or a smaller footprint on a system board.

One common type of PoP uses two packages that each have a bottom BGA (Ball Grid Array) for connection to external components. An interposer is used between the two packages for interconnection between the two vertically discrete components.

BRIEF DESCRIPTION OF THE DRAWINGS

Embodiments are illustrated by way of example, and not by way of limitation, in the figures of the accompanying drawings in which like reference numerals refer to similar elements.

DETAILED DESCRIPTION

A PoP (Package on Package) structure may be assembled by integrating QFP (Quad Flat Package) and QFN (Quad Flat Non-Lead) packages using both external leads and a land solder pad on both sides of a device. The land solder pad creates an interconnection between the two stacked discrete packages for a PoP stack design.

The PoP described herein does not require an interposer between the packages. This simplifies the assembly of the structure, simplifies the packaging process flow and reduces the manufacturing cost. Using lead frame packages, the overall material cost is also reduced.

As described herein a QFN and a QFP package are combined to establish a solder pad with a lead interconnection on at least two sides of one of the component packages. The other component can be attached using wire leads to the solder pad to form the PoP package.

Figure 1:
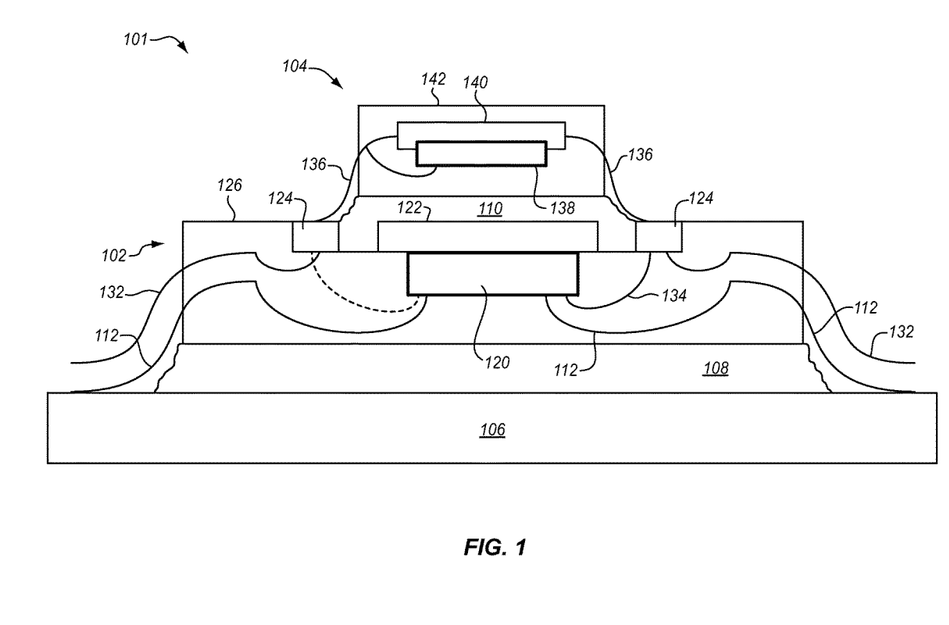
FIG. 1 is a cross-sectional side view diagram of a stacked package with a land pad for connections between the dies according to an embodiment.

FIG. 1 shows a PoP assembly 101 with a bottom package 102 and a top package 104 stacked over the bottom package to form the stacked package assembly. The two packages are mounted to a main board 106, such as a PCB (Printed Circuit Board). The main board may be a motherboard, system board, or another type of wiring board. The board supplies power and data input and output to the two stacked packages of the assembly. The main board is provided as an example. The stacked packages may be coupled to any of a variety of other mounting devices, including a socket. The bottom package is attached using an adhesive or paste 108 or any other desired material.

The bottom package in the illustrated example is a shown as similar to a normal QFP (Quad Flat Package). However, embodiments are not so limited. The package contains an IC die 120 with a back side attached to a die paddle 122. The die paddle is formed of a material with good thermal conductivity such as copper, aluminum, or an alumina. The die paddle is substantially flat. In the illustrated example it has a flat bottom side attached to the back side of the die and a flat top side opposite the bottom side and is much thinner than it is wide or long. The die paddle is longer and wider than the die and the thickness is sufficient to provide the desired mechanical stability when attached to the die. The die paddle may have shapes, profiles or features on either the top side, the bottom side or both. As an example, the bottom side of the die paddle may be shaped to provide a more secure or better thermal conducting attachment to the die.

The die paddle in this package configuration serves in part as a heat sink to conduct heat away from the die. The back side of the die is dielectric or coated with a dielectric so that the die does not create any electrical connections with the back side of the die.

Several different types of wire lead connections are made to the die and to the paddle as described in more detail below. After the wire leads are in place, the die and the paddle are encapsulated in a molding compound 126 such as a resin. The molding compound is then removed to expose the top side of the die paddle. The top side, as shown, is the side of the die paddle that is opposite the die. It is not necessary for the entire die paddle top side to be exposed.

Alternatively, only the edges or perimeter may be exposed so that the center of the die paddle is still covered by the mold compound.

The exposed die paddle is cut near its outer edge to create an isolated land pad 124 external to the die and external to the center of the package. The land pad may be cut from the paddle using partial ablation, blade sawing or by using a half-etch lead frame such as for DR-QFN (Dual Row-Quad Flat Non-Lead) packages. As shown in this cross sectional view, the paddle is cut on two sides, near its edge. The paddle may be cut on only one end, on two ends or around the complete periphery of the paddle. The cuts are made near the outer edge of the paddle so that the paddle's effectiveness for holding, stabilizing, and cooling the die is not affected. The paddle may be made larger so that when the edge of the paddle is cut, the remaining paddle attached to the die is then no smaller than for a conventional package.

Because the paddle is typically made of a thermally conducting material, the material of the die may also function as an electrical conductor. The land pad 124 cut from the die paddle 122 may be used as a connection location for wire leads.

The side of the die opposite the paddle is covered with the molding compound. This is the front side of the die. The package provides for connection to the front side of the die using wire leads 112. The wire leads are connected to the front side of the die and are configured to make a connection to an appropriate pad or contact of the main board 106. Wire leads of the type used in a normal QFP package may be used. The leads may extend on all four sides of the package from the die directly out of the mold compound to the main board.

The top side of the bottom package has a QFN-like solder pad 124 that is formed by, for example, a partial ablation or half-etching process. The pads create a connection between the top package and the bottom package. The top package may be any desired type of wire lead package such as a QFP, QFN TSOP (Thin Small Outline Package), or a BGA (Ball Grid Array) package. The wire leads of the top package 136 extend from the top package to connect to the top surface of the land pad 124.

In addition, wire leads are used to electrically connect the bottom die to the top die. The connections may be used for data signals, control signals, and power signals, among others. The bottom package has wire leads 134 from the front side of the bottom die to the underside of the land pad 124. The land pad makes an electrical connection between the wire lead on it underside to the corresponding wire lead 136 on is top side. This allows the dies to be connected directly together through the land pad without relying on the main board.

Additional wire leads 132 extend from the land pad 124 to the main board. These wire leads allow the die of the top package to be connected to the main board. Accordingly the land pad provides connections for the die 138 of the top package to either the die of the bottom package or the main board, depending on how the land pad is connected.

The top package may take any of a variety of different forms as mentioned above, such as QFN, QFP, TSOP or BGA. In the illustrated example, the top package 104 has a die 138 attached on its back side to a die paddle 140. Wire leads 136 are connected to the front side of the die and extend outwards away from the die to connect to the land pad 124 of the bottom die. The die, paddle, and wire leads are covered in mold compound 142. The top package is attached to the bottom package solder joints on wire leads. This may be enhanced using a paste, adhesive, or other suitable material 110. In this example, the front side of the die of the top package is facing the bottom package. This allows for shorter wire lead connections 136 to the land pad. The die paddle 140 is on the opposite side or top side of the top package to improve heat dissipation.

Figure 2:
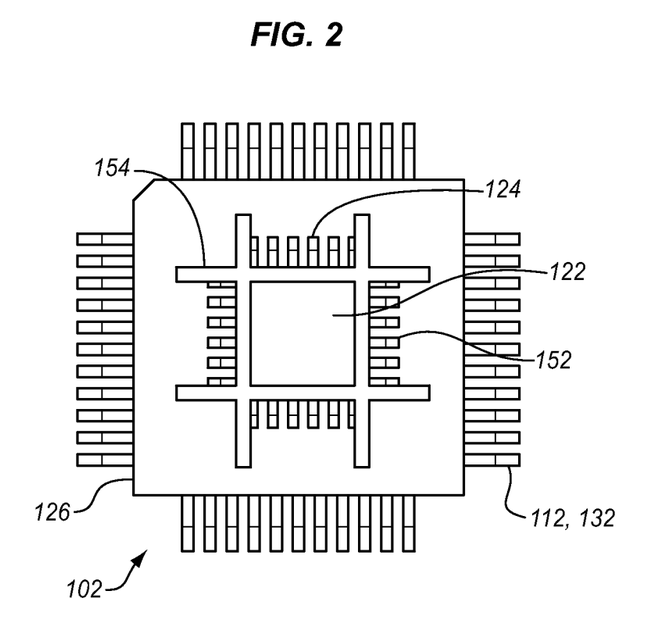
FIG. 2 is a top plan view of the bottom package of the stacked package of FIG. 1 according to an embodiment.

FIG. 2 is a top elevation view of the bottom package 102 showing the die paddle 122 and the surrounding mold compound 126. The die paddle has been cut, ablated, sawed, or etched to form kerfs 154 that isolate the edge 124 of the die paddle from the center 122 of the die paddle to form the land pad 124. The cuts may be straight or curved. In this example four cuts have been made to completely isolate the periphery of the die paddle from the main center of the die paddle 122. The resulting land pad 124 surrounds the center circumferentially. Alternatively one or two cuts may be made to provide a smaller land pad. Wire leads 112, 132 extend from the underside of the land pad to make connections with the main board. Wire leads that connect to the top side of the land pad will come from the top package and are not shown.

The land pad is cut from the die paddle which is made from a thermally conducting material such as copper, aluminum, or a similar alloy. These materials are also electrically conductive. The land pad 124 has an array of connection points, pads, or strips 152 for the top package wire leads 136. There may also be a similar array of connection points on the underside of the land pad for all of the other wire leads 112, 132. The connection points may be isolated from each other based on an original wire lead frame or in any other way, such as partial ablation, deposition of a dielectric in between the connection points, covering the entire surface in a dielectric and then forming individual connection points over the dielectric by printing, deposition, tape application, etc.

Figure 3:
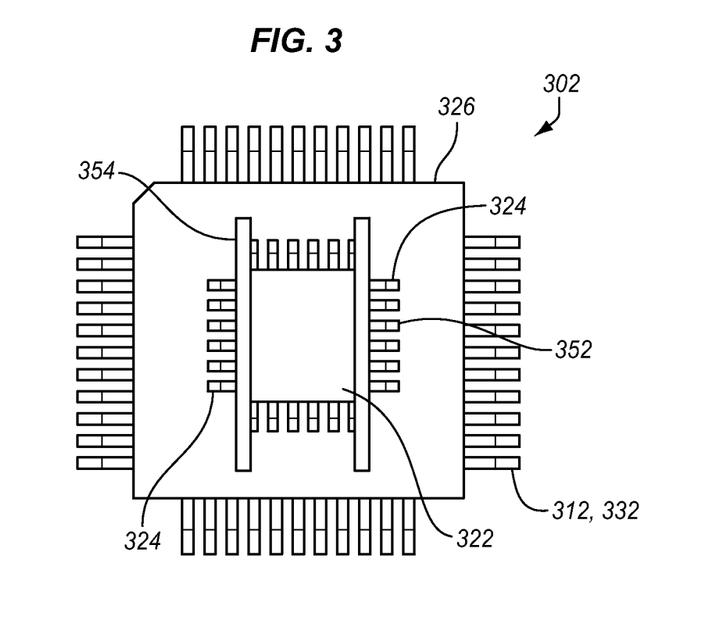
FIG. 3 is a top plan view of an alternative bottom package for a stacked package according to an embodiment.

FIG. 3 shows an alternative configuration in which a bottom package 302 has a die paddle 322 attached to a die (not shown). Wire leads from the die 312 and the land pad 332 extend outward to connect to the main board. The die paddle has two partial ablation saw kerfs 354 or cuts one on each of two opposite sides of the rectangular die paddle. This creates two separate land pads 324. While there is less overall surface area for connections, such a configuration allows different connections to be completely isolated. As an example, the land pad on one side may be used for power, while the land pad on the other side may be used for high frequency data signals. The two different types of signals will be better isolated in this example than in the configuration or FIG. 2. The die paddle may be cut in a variety of different ways to form one or more land pads. The die paddle may also be made in different shapes, including square and rectangular, depending on the desired shape of the package and the land pads.

Figure 4:
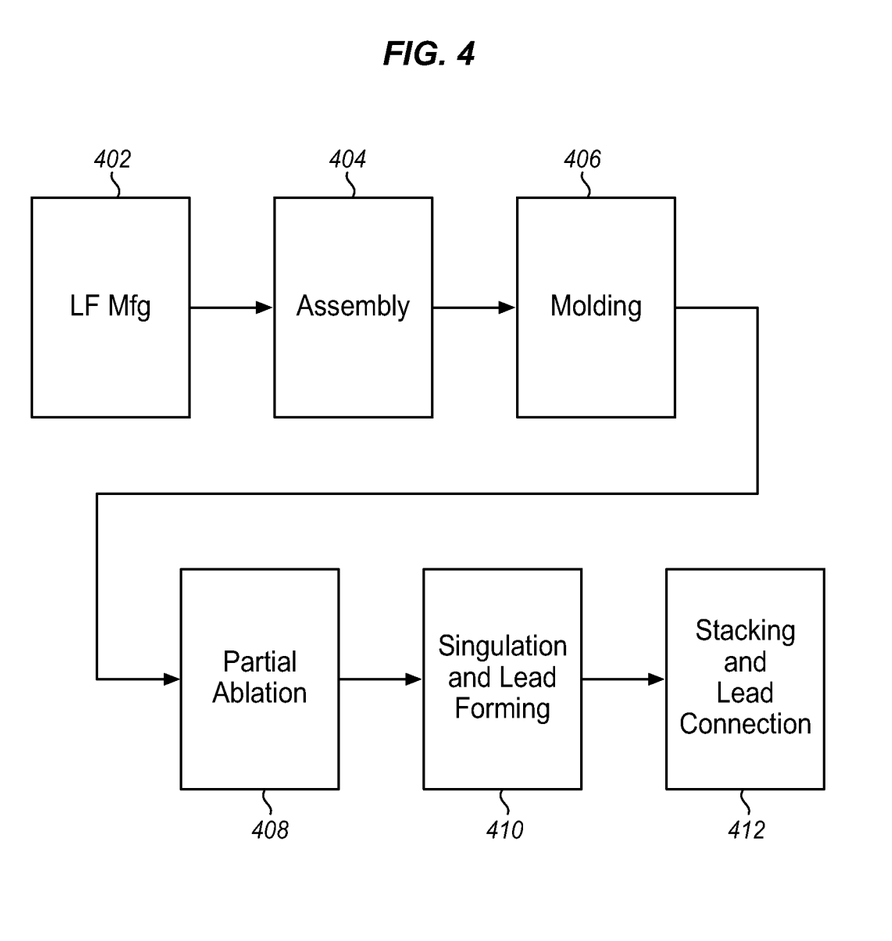
FIG. 4 is a process flow diagram of producing the stacked package according to an embodiment.

FIG. 4 is a process flow diagram of forming a stack of packages as described. The process starts at 402 with fabricating the top and bottom die paddles. For the bottom paddle, this process may include down-set or half-etch techniques to create the electrically separated land pads as described above. At 404, the dies are completed and diced. The front end of the line fabrication stage is completed. The wires are bonded to the front side of the dies and the dies are attached to the respective paddles. Some of the bonded wire leads from the bottom die are also attached to respective parts of the underside of the bottom die paddle.

At 406, the package is encapsulated in a mold compound. Typically the die is a resin, however, other molding compounds may be used to suit particular applications. The mold covers all of the die, most of the wire leads, and all or some of the die paddles as described above. At 408 the die paddle on the bottom package is cut to separate the solder land pad from the main central area of the die paddle. As mentioned above, there are different ways to cut the die paddle. The die paddle is made from a metal, ceramic, or other thermally conductive material and it may be sawed, ablated, laser cut, or etched among other techniques.

After the die is attached to the paddle, the wire leads are bonded, and the land lead and outer lead are formed, the die package may then be singulated. For the top package the process is similar but the die paddle is not cut. A QFP or TSOP package process may be used. Finally at 412, the die packages are stacked and the wire leads from the top package are bonded to the solder land pad of the bottom package. In the fabrication of the top package, the form factor of the top package and the lead formation are aligned with land pad design on the top side of the bottom package.

Figure 5:
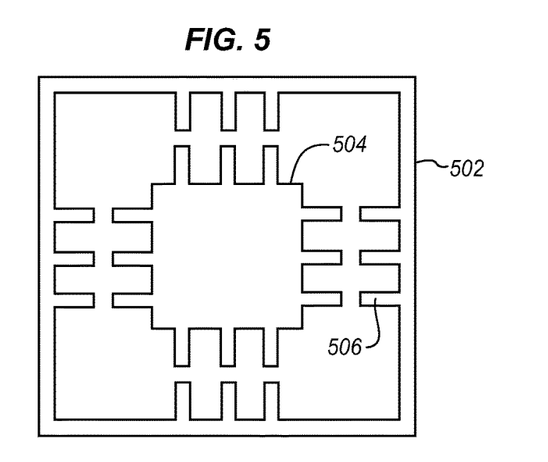
FIGS. 5 to 10 are plan views of fabrication stages of a bottom package according to an embodiment.

FIGS. 5 to 10 show processing stages of the bottom package as described in FIG. 4. FIG. 5 is a bottom plan view of a lead frame 501, with an integrated die paddle 504 in the center of the frame and leads 506 coming from the die paddle to the lead frame. The lead frame is typically made from a large substrate and then each frame is sliced from the larger substrate.

Figure 6:
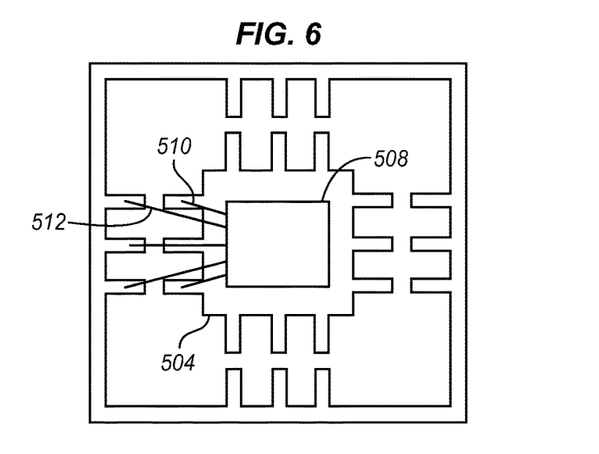

FIG. 6 shows the IC die 508 attached to the bottom of the die paddle 504. The die is physically attached using solder or paste and electrically attached with wire leads 510, 512. A first group of wire leads 510 is attached to an inner portion of the lead frame leads 606 and a second group of wire leads 512 is attached to an outer portion of the lead frame leads. The different connections allow for the die to connect to different components and provide for more connection flexibility.

Figure 7:
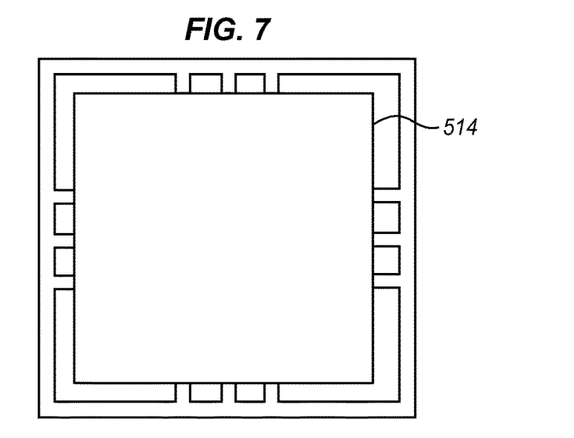

In FIG. 7, the underside of the lead frame has been encapsulated in mold compound 514. In the illustrated example, the mold compound covers the paddle and the die and a portion of the lead frame leads. The mold compound provides a rigid structure for the assembly so that the frame 502 of the lead frame may then be removed.

Figure 8:
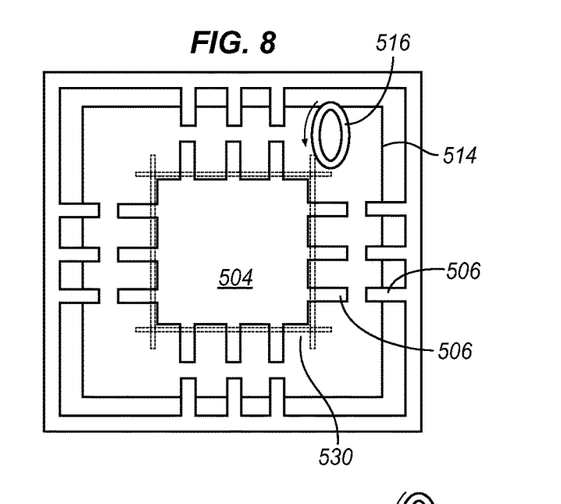

FIG. 8 is a top plan view of the assembly of FIG. 7. In this view the die paddle 504 and the leads 506 extending from the die paddle are clearly seen. The assembly is then modified by partial ablation, sawing, or etching 516 the edges of the die paddle to create the land pad described above. The saw operation creates a kerf 530 around the paddle that isolates the land pad from the die paddle. The isolation may also be achieved by partially etching off the desired part of the metal lead to form the isolated land pad. This provides a structure for attaching wire leads of a second package (not shown) as described above.

Figure 9:
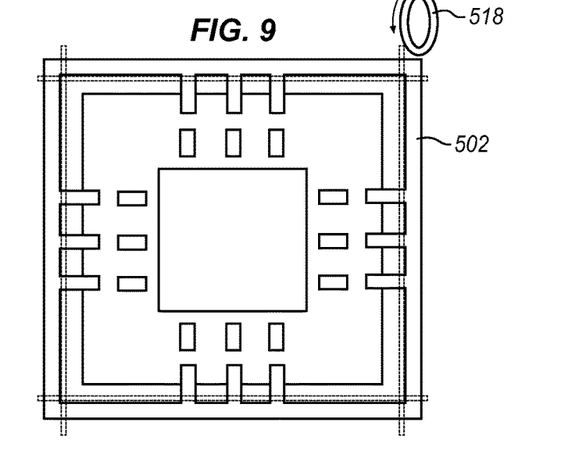
Figure 10:
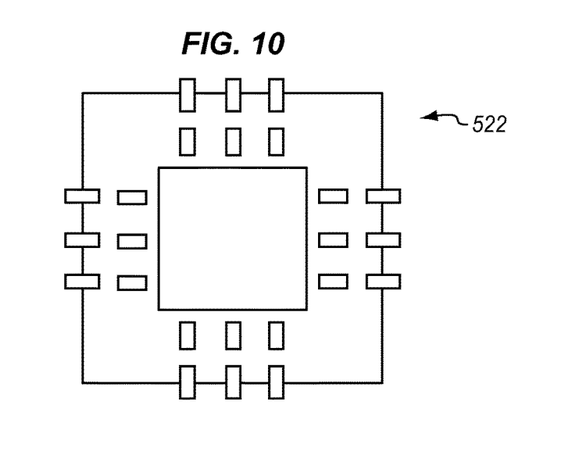

FIG. 9 shows a second saw operation 518 in which the outer frame 502 of the lead frame is removed. The results in the final finished bottom package 522 as shown in FIG. 10. FIG. 10 is a top plan view of a bottom package for a package on package assembly. Such a package may be used as the bottom package 102 for a PoP assembly 101 as show in FIG. 1.

While the embodiments described herein have a single bottom package and a single top package there may be three or more packages stacked vertically in a single PoP assembly. The wire leads of the top packages allow the top packages to be connected to the land pad in any way that may be desired. In addition, there may be more than one die in the bottom or top package. The dies may be arranged horizontally so that the top die may connect with two or more bottom dies in the same package. In addition two or more top dies arranged side-by-side may be coupled to the land pad of the bottom package.

Figure 11:
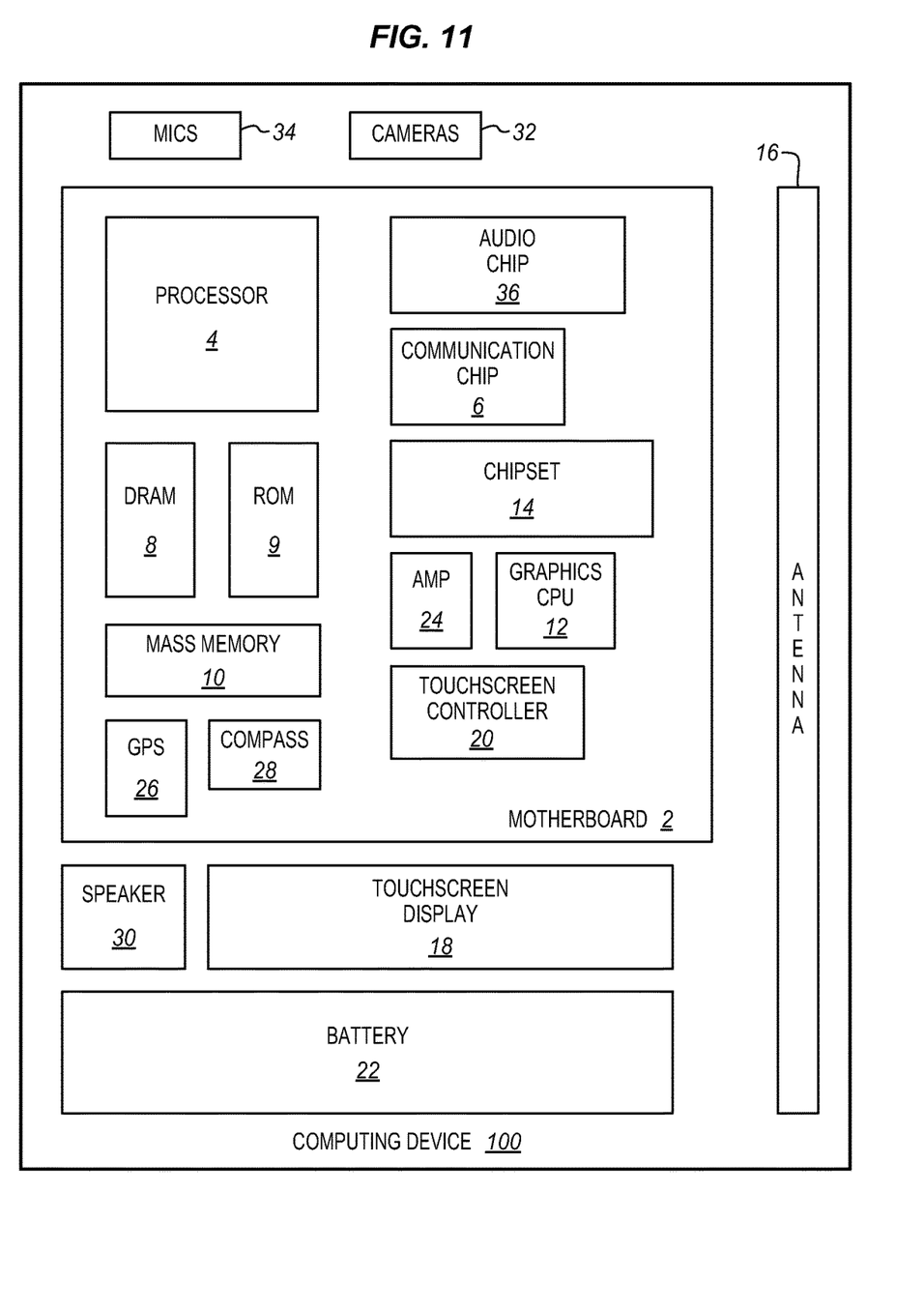
FIG. 11 is a block diagram of a computing device incorporating a stacked package-on-package product according to an embodiment.

FIG. 11 illustrates a computing device 100 in accordance with one implementation. The computing device 100 houses a system board 2. The board 2 may include a number of components, including but not limited to a processor 4 and at least one communication package 6. The communication package is coupled to one or more antennas 16. The processor 4 is physically and electrically coupled to the board 2.

Depending on its applications, computing device 100 may include other components that may or may not be physically and electrically coupled to the board 2. These other components include, but are not limited to, volatile memory (e.g., DRAM) 8, non-volatile memory (e.g., ROM) 9, flash memory (not shown), a graphics processor 12, a digital signal processor (not shown), a crypto processor (not shown), a chipset 14, an antenna 16, a display 18 such as a touchscreen display, a touchscreen controller 20, a battery 22, an audio codec (not shown), a video codec (not shown), a power amplifier 24, a global positioning system (GPS) device 26, a compass 28, an accelerometer (not shown), a gyroscope (not shown), a speaker 30, a camera 32, and a mass storage device (such as hard disk drive) 10, compact disk (CD) (not shown), digital versatile disk (DVD) (not shown), and so forth). These components may be connected to the system board 2, mounted to the system board, or combined with any of the other components.

The communication package 6 enables wireless and/or wired communications for the transfer of data to and from the computing device 100. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication package 6 may implement any of a number of wireless or wired standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, Ethernet derivatives thereof, as well as any other wireless and wired protocols that are designated as 3G, 4G, 5G, and beyond. The computing device 100 may include a plurality of communication packages 6. For instance, a first communication package 6 may be dedicated to shorter range wireless communications such as Wi-Fi and Bluetooth and a second communication package 6 may be dedicated to longer range wireless communications such as GPS, EDGE, GPRS, CDMA, WiMAX, LTE, Ev-DO, and others.

Any one or more of the chips may be packaged as described herein or several of the chips may be combined into a single package a land pad and wire leads for connections to the system board as described.

In various implementations, the computing device 100 may be a server, a workstation, a laptop, a netbook, a notebook, an ultrabook, a smartphone, a tablet, a personal digital assistant (PDA), an ultra mobile PC, a mobile phone, a printer, a scanner, a monitor, a set-top box, an entertainment control unit, a digital camera, a portable music player, or a digital video recorder or devices termed internet of things (IoT). In further implementations, the computing device 100 may be any other electronic device, such as a pen, a wallet, a watch, or an appliance that processes data.

Embodiments may be implemented as a part of one or more memory chips, controllers, CPUs (Central Processing Unit), microchips or integrated circuits interconnected using a motherboard, an application specific integrated circuit (ASIC), and/or a field programmable gate array (FPGA).

References to "one embodiment", "an embodiment", "example embodiment", "various embodiments", etc., indicate that the embodiment(s) of the invention so described may include particular features, structures, or characteristics, but not every embodiment necessarily includes the particular features, structures, or characteristics. Further, some embodiments may have some, all, or none of the features described for other embodiments.

In the following description and claims, the term "coupled" along with its derivatives, may be used. "Coupled" is used to indicate that two or more elements co-operate or interact with each other, but they may or may not have intervening physical or electrical components between them.

As used in the claims, unless otherwise specified, the use of the ordinal adjectives "first", "second", "third", etc., to describe a common element, merely indicate that different instances of like elements are being referred to, and are not intended to imply that the elements so described must be in a given sequence, either temporally, spatially, in ranking, or in any other manner.

The drawings and the forgoing description give examples of embodiments. Those skilled in the art will appreciate that one or more of the described elements may well be combined into a single functional element. Alternatively, certain elements may be split into multiple functional elements. Elements from one embodiment may be added to another embodiment. For example, orders of processes described herein may be changed and are not limited to the manner described herein. Moreover, the actions of any flow diagram need not be implemented in the order shown; nor do all of the acts necessarily need to be performed. Also, those acts that are not dependent on other acts may be performed in parallel with the other acts. The scope of embodiments is by no means limited by these specific examples. Numerous variations, whether explicitly given in the specification or not, such as differences in structure, dimension, and use of material, are possible. The scope of embodiments is at least as broad as given by the following claims.

The following examples pertain to further embodiments. The various features of the different embodiments may be variously combined with some features included and others excluded to suit a variety of different applications. Some embodiments pertain to a stacked package assembly that includes a first die having a front side and a back side, a die paddle attached to the back side of the first die, a plurality of wire leads, one end being connected to the front side of the die for connection to an external device, a mold compound encapsulating the first die and at least a portion of the die paddle, a land pad cut from the die paddle and supported by the mold compound, a second plurality of wire leads, one end of the wire leads being connected to the front side of the first die and the other end of the wire leads being connected to the land pad, a second die stacked over the die paddle and a third plurality of wire leads, one end being connected to the second die and the other end being connected to the land pad.

In further embodiments the die paddle and the land pad are formed of either a copper, an alumina, or a copper alloy.

In further embodiments the die paddle has a bottom side attached to the back side of the die and a top side, the top side not being covered in mold compound.

In further embodiments the die paddle is wider than the first die and wherein the land pad is cut from the width of the first die paddle.

In further embodiments the land pad is external to the first die.

In further embodiments, the land pad is around the complete periphery of the die paddle.

In further embodiments the land pad has a plurality of solder pads to connect to a respective other end of the wire leads of the second plurality of wire leads.

In further embodiments the second plurality of wire leads and the third plurality of wire leads connect the first die to the second die through the land pad without connecting to an external device.

In further embodiments the second die has a front side and a back side, wherein the back side is attached to a second die paddle, wherein the second die is encapsulated in a second mold compound and wherein the second mold compound is attached to the first die paddle.

Some embodiments pertain to a computing device that includes a system board, a communications package connected to the system board, and stacked package assembly connected to the system board having a first die having a front side and a back side, a die paddle attached to the back side of the first die, a plurality of wire leads, one end being connected to the front side of the die and the other being connected to the system board, a mold compound encapsulating the first die and at least a portion of the die paddle, a land pad cut from the die paddle and supported by the mold compound, a second plurality of wire leads, one end of the wire leads being connected to the front side of the first die and the other end of the wire leads being connected to the land pad, a second die stacked over the die paddle, and a third plurality of wire leads, one end being connected to the second die and the other end being connected to the land pad.

In further embodiments the die paddle has a bottom side attached to the back side of the die and a top side, the top side not being covered in mold compound.

In further embodiments the die paddle is wider than the first die and wherein the land pad is cut from the width of the first die paddle so that the land pad is external to the first die.

In further embodiments the land pad has a plurality of solder pads to connect to a respective other end of the wire leads of the second plurality of wire leads.

In further embodiments the second plurality of wire leads and the third plurality of wire leads connect the first die to the second die through the land pad without connecting to an external device.

Some embodiments pertain to a method that includes attaching a back side of a first die to a die paddle, connecting a plurality of wire leads to a front side of the die at one end for connection to an external device, connecting a second plurality of wire leads to the front side of the first die at one end to an edge of the die paddle at the other end, encapsulating the first die and at least a portion of the die paddle in a mold compound, cutting a land pad from the die paddle, wherein an edge of the die paddle is a part of the land pad, stacking a second die over the die paddle, and connecting a third plurality of wire leads, one end to the second die and the other end to the land pad.

In further embodiments the land pad is supported by the mold compound.

In further embodiments the die paddle has a bottom side attached to the back side of the die and a top side, the method further comprising exposing top side of the die paddle from the mold compound before cutting the land pad.

In further embodiments the die paddle has a rectangular surface and wherein cutting the land pad comprises cutting the land pad on four sides of the paddle.

Further embodiments include applying a plurality of solder pads to the land pad to connect to a respective other end of the wire leads of the second plurality of wire leads.

In further embodiments cutting the land pad comprises cutting by laser ablation.

In further embodiments the second die has a front side and a back side, the method further comprising attaching the back side to a second die paddle, encapsulating the second die in a second mold compound and attaching the second mold compound to the first die paddle.

The invention claimed is:

1. A stacked package assembly comprising:
a first die having a front side and a back side;
a die paddle attached to the back side of the first die;
a plurality of wire leads, one end being connected to the front side of the die for connection to an external device;
a mold compound encapsulating the first die and at least a portion of the die paddle;
a land pad cut from the die paddle and supported by the mold compound;
a second plurality of wire leads, one end of the wire leads being connected to the front side of the first die and the other end of the wire leads being connected to the land pad;
a second die stacked over the die paddle; and a third plurality of wire leads, one end being connected to the second die and the other end being connected directly to the land pad; and
the assembly, further comprising a second die paddle attached to the back side of the second die, wherein the front side of the second die is facing the first die paddle and wherein the third plurality of wire leads extend from the front side of the second die to the land pad.

2. The assembly of claim 1, wherein the die paddle and the land pad are formed of either a copper, an alumina, or a copper alloy.

3. The assembly of claim 1, wherein the die paddle is wider than the first die and wherein the land pad is cut from the width of the first die paddle.

4. The assembly of claim 1, wherein the land pad is external to the first die.

5. The assembly of Claim 1, wherein the land pad is around the complete periphery of the die paddle.

6. The assembly of claim 1, wherein the land pad has a plurality of solder pads to connect to a respective other end of the wire leads of the second plurality of wire leads.

7. The assembly of claim 1, wherein the second plurality of wire leads and the third plurality of wire leads connect the first die to the second die through the land pad without connecting to an external device.

8. The assembly of claim 1, wherein the second die has a front side and a back side, wherein the back side is attached to a second die paddle, wherein the second die is encapsulated in a second mold compound and wherein the second mold compound is attached to the first die paddle.

9. A computing device comprising:
a system board;
a communications package connected to the system board; and
stacked package assembly connected to the system board having a first die having a front side and a back side, a die paddle attached to the back side of the first die, a plurality of wire leads, one end being connected to the front side of the die and the other being connected to the system board, a mold compound encapsulating the first die and at least a portion of the die paddle, a land pad cut from the die paddle and supported by the mold compound, a second plurality of wire leads, one end of the wire leads being connected to the front side of the first die and the other end of the wire leads being connected to the land pad, a second die stacked over the die paddle, and a third plurality of wire leads, one end being connected to the second die and the other end being connected directly to the land pad; and
the computing device further comprising a second die paddle attached to the back side of the second die, wherein the front side of the second die is facing the first die paddle and wherein the third plurality of wire leads extend from the front side of the second die to the land pad.

10. The computing device of claim 9, wherein the die paddle is wider than the first die and wherein the land pad is cut from the width of the first die paddle so that the land pad is external to the first die.

11. The computing device of claim 9, wherein the land pad has a plurality of solder pads to connect to a respective other end of the wire leads of the second plurality of wire leads.

12. The computing device of claim 9, wherein the second plurality of wire leads and the third plurality of wire leads connect the first die to the second die through the land pad without connecting to an external device.

13. A method comprising:
attaching a back side of a first die to a die paddle;
connecting a first plurality of wire leads to a Front side of the die at one end for connection to an external device;
connecting a second plurality of wire leads to the front side of the first die at one end to an edge of the die paddle at the other end;
encapsulating the first die and at least a portion of the die paddle in a mold compound;
cutting a land pad from the die paddle, electrically separating the land pad from the die paddle by the cut, wherein an edge of the die paddle is a part of the land pad and;
stacking a second die over the die paddle; and
connecting a third plurality of wire leads, one end to the second die and the other end directly to the land pad; and
wherein the second die has a front side and a back side, the method further comprising attaching the back side to a second die paddle, wherein the front side of the second die is facing the first die paddle and wherein the third plurality of wire leads extend from the front side of the second die to the land pad; encapsulating the second die in a second mold compound and attaching the second mold compound to the first die paddle.

14. The method of claim 13, wherein the land pad is supported by the mold compound.

15. The method of claim 13, wherein the die paddle has a bottom side attached to the back side of the die and a top side, the method further comprising exposing top side of the die paddle from the mold compound before cutting the land pad.

16. The method of claim 13, wherein the die paddle has a rectangular surface and wherein cutting the land pad comprises cutting the land pad on four sides of the paddle.

17. The method of claim 1, further comprising applying a plurality of solder pads to the land pad to connect to a respective other end of the wire leads of the second plurality of wire leads.

18. The method of claim 13, wherein cutting the land pad comprises cutting by laser ablation.

* * * * *